US008164147B2

(12) United States Patent
Asao

(10) Patent No.: US 8,164,147 B2
(45) Date of Patent: Apr. 24, 2012

(54) MAGNETIC RANDOM ACCESS MEMORY

(75) Inventor: Yoshiaki Asao, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1003 days.

(21) Appl. No.: 12/022,473

(22) Filed: Jan. 30, 2008

(65) Prior Publication Data

US 2008/0203503 A1    Aug. 28, 2008

(30) Foreign Application Priority Data

Jan. 31, 2007 (JP) ................................ 2007-022247

(51) Int. Cl.
*H01L 29/82* (2006.01)
(52) U.S. Cl. ............... 257/421; 257/379; 257/E29.323; 365/158; 365/171
(58) Field of Classification Search .................. 257/421, 257/E29.323, 379, E21.645, E27.081; 365/158, 365/171
See application file for complete search history.

(56) References Cited

U.S. PATENT DOCUMENTS

| | | | |
|---|---|---|---|
| 6,587,371 B1 * | 7/2003 | Hidaka | 365/173 |
| 2004/0057281 A1 * | 3/2004 | Ooishi | 365/173 |
| 2004/0108561 A1 * | 6/2004 | Jeong | 257/422 |

OTHER PUBLICATIONS

M. Hosomi, et al., "A Novel Nonvolatile Memory with Spin Torque Transfer Magnetization Switching: Spin-RAM", IEDM Tech. Dig., 2005, 4 Pages.
J.C. Slonczewski, "Current-driven excitation of magnetic multilayers", Journal of Magnetism and Magnetic Materials, vol. 159, 1996, pp. L1-L7.

* cited by examiner

*Primary Examiner* — Thomas L Dickey
*Assistant Examiner* — Fazli Erdem
(74) *Attorney, Agent, or Firm* — Oblon, Spivak, McClelland, Maier & Neustadt, L.L.P.

(57) ABSTRACT

A magnetic random access memory includes a first bit line and a second bit line, a source line formed for a group having the first bit line and the second bit line, adjacent to the first bit line, and running in a first direction in which the first bit line and the second bit line run, a first magnetoresistive effect element connected to the first bit line, a second magnetoresistive effect element connected to the second bit line, a first transistor connected in series with the first magnetoresistive effect element, and a second transistor connected in series with the second magnetoresistive effect element. A first cell having the first magnetoresistive effect element and the first transistor and a second cell having the second magnetoresistive effect element and the second transistor are connected together to the source line.

20 Claims, 10 Drawing Sheets

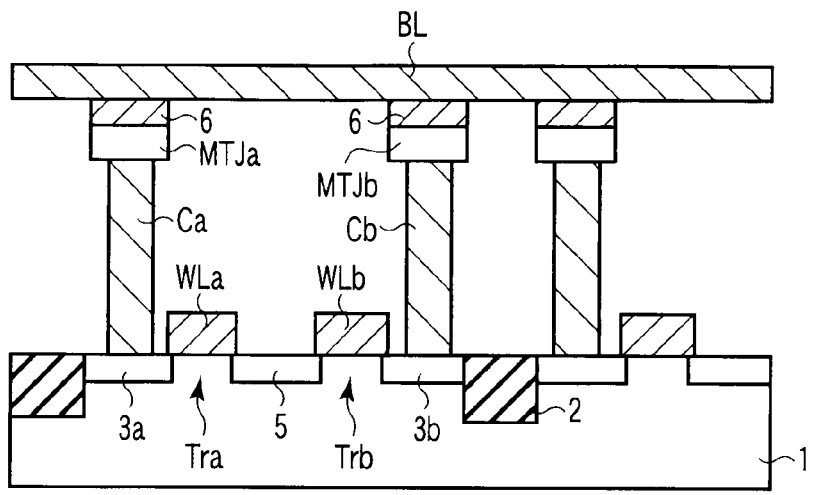
FIG. 2
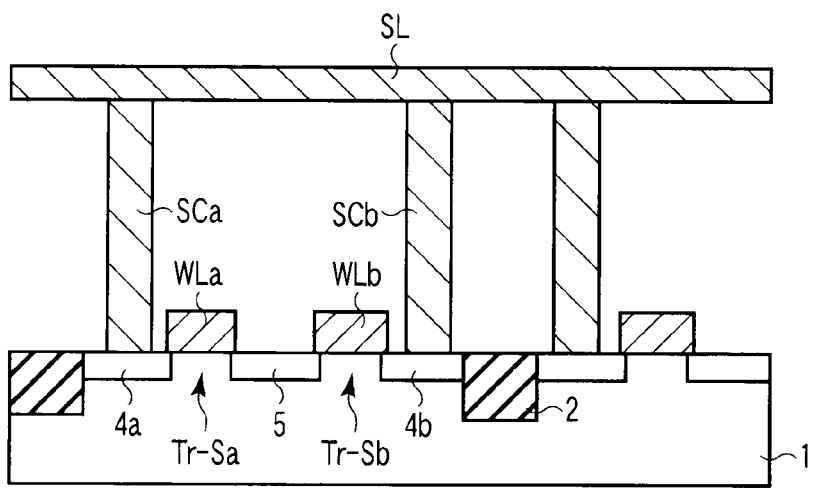
FIG. 3
FIG. 4
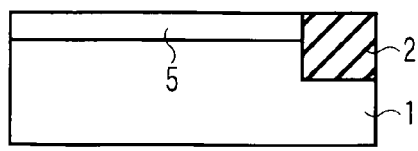

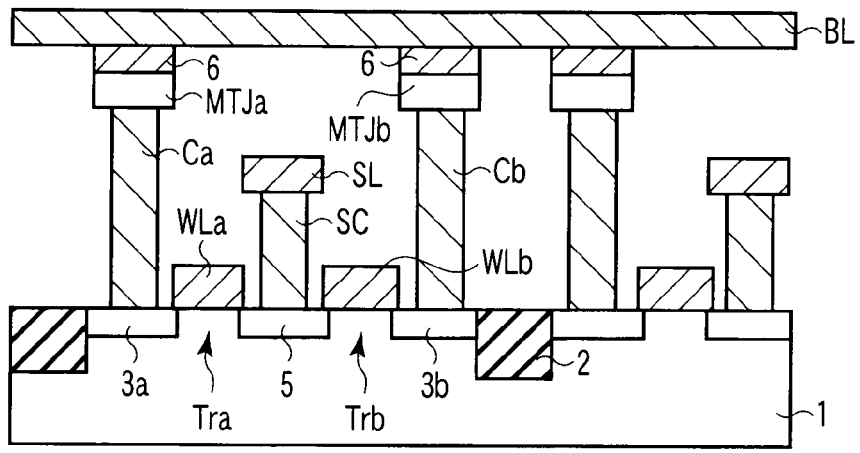
F I G. 14
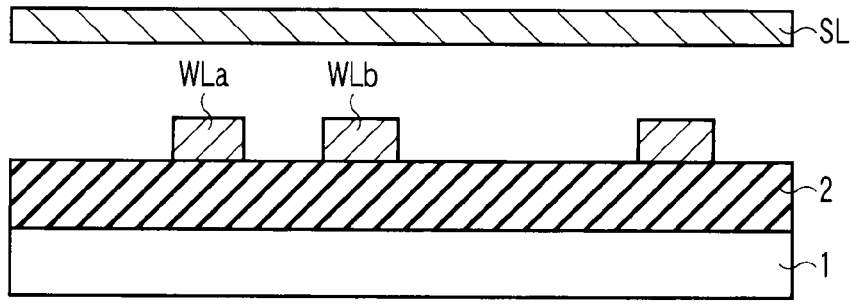
F I G. 15
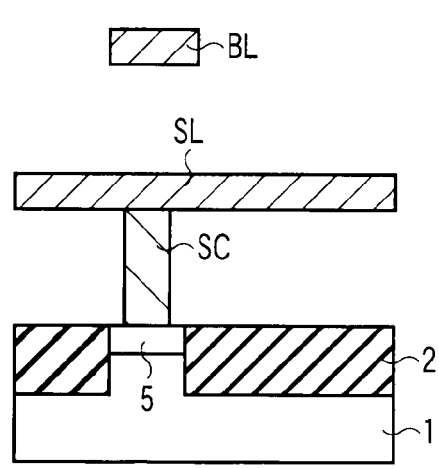
F I G. 16

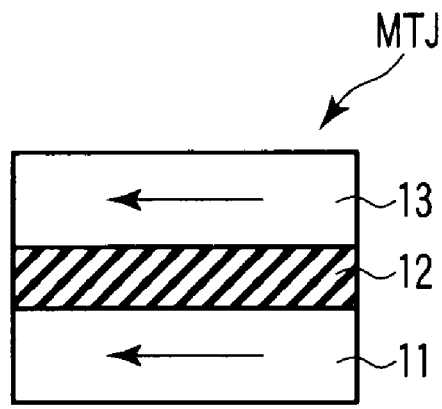
Parallel (low resistance)
F I G. 18A
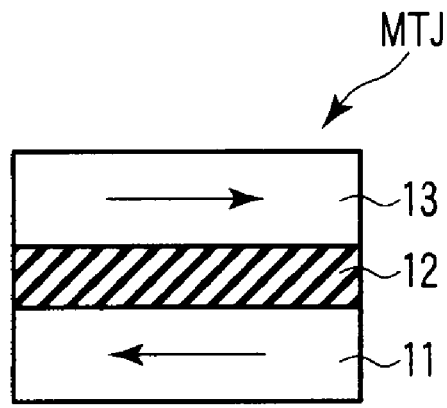
Antiparallel (high resistance)
F I G. 18B
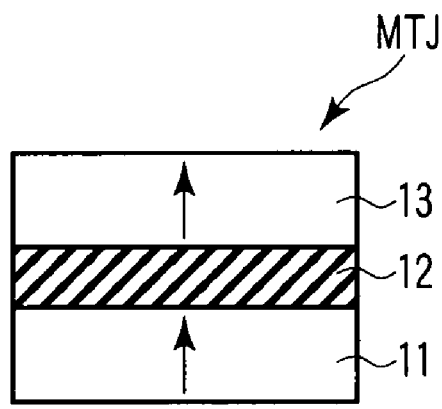
Parallel (low resistance)
F I G. 19A
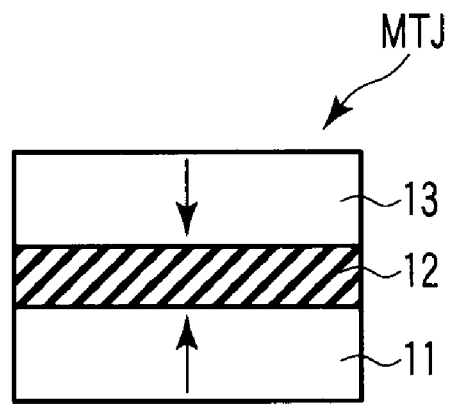
Antiparallel (high resistance)
F I G. 19B

MAGNETIC RANDOM ACCESS MEMORY

CROSS-REFERENCE TO RELATED APPLICATIONS

This application is based upon and claims the benefit of priority from prior Japanese Patent Application No. 2007-022247, filed Jan. 31, 2007, the entire contents of which are incorporated herein by reference.

BACKGROUND OF THE INVENTION

1. Field of the Invention

The present invention relates to a spin injection magnetization reversal type magnetic random access memory (MRAM).

2. Description of the Related Art

Recently, a spin injection magnetization reversal type magnetic random access memory (e.g., non-patent reference 1) is proposed as a magnetic random access memory (MRAM). A cell of this magnetic random access memory comprises an MTJ (Magnetic Tunnel Junction) element and switching transistor. In a write operation using the spin injection magnetization reversing technique, an electric current is supplied perpendicularly to the film surface of the MTJ element, and the magnetization direction in a recording layer is changed by the direction of this electric current.

Unfortunately, in a one transistor+one MTJ type memory cell of the spin injection magnetization reversal type magnetic random access memory, if a common interconnection (common source line) shared by another cell on the transistor side and a common interconnection (bit line) shared by another cell on the MTJ side are perpendicular to each other, all unselected bit lines must be charged to a predetermined potential in a write cycle. This decreases the operating speed.

To solve the above problem, it is possible to form the common source line and bit line parallel to each other. In this case, the common source line runs between bit lines, and MTJ elements are formed below the bit lines. Consequently, a contact connecting each MTJ element and a drain diffusion layer is formed close to the common source line. In order to prevent this, the cell size cannot be made smaller than 8 $F^2$.

[Non-patent Reference 1] IEDM2005 Technical Digest p. 473-476 "A Novel Nonvolatile Memory with Spin Torque Transfer Magnetization Switching: Spin-RAM" or J. of Magn. Magn. Mater., 159, L1(1996) "Current-driven excitation of magnetic multilayers"

BRIEF SUMMARY OF THE INVENTION

A magnetic random access memory according to an aspect of the present invention comprising a first bit line and a second bit line, a source line formed for a group having the first bit line and the second bit line, adjacent to the first bit line, and running in a first direction in which the first bit line and the second bit line run, a first magnetoresistive effect element connected to the first bit line, a second magnetoresistive effect element connected to the second bit line, a first transistor connected in series with the first magnetoresistive effect element, and a second transistor connected in series with the second magnetoresistive effect element, wherein a first cell having the first magnetoresistive effect element and the first transistor and a second cell having the second magnetoresistive effect element and the second transistor are connected together to the source line.

BRIEF DESCRIPTION OF THE SEVERAL VIEWS OF THE DRAWING

FIG. 2 is a sectional view taken along a line II-II in FIGS. 1 and 17;

FIG. 3 is a sectional view taken along a line III-III in FIGS. 1 and 17;

FIG. 4 is a sectional view taken along a line IV-IV in FIGS. 1 and 17;

FIG. 14 is a sectional view taken along a line XIV-XIV in FIG. 13;

FIG. 15 is a sectional view taken along a line XV-XV in FIG. 13;

FIG. 16 is a sectional view taken along a line XVI-XVI in FIG. 13;

FIGS. 18A and 18B are sectional views of a parallel magnetization type MTJ element according to each embodiment of the present invention; and FIGS. 19A and 19B are sectional views of a perpendicular magnetization type MTJ element according to each embodiment of the present invention.

DETAILED DESCRIPTION OF THE INVENTION

Figure 1:
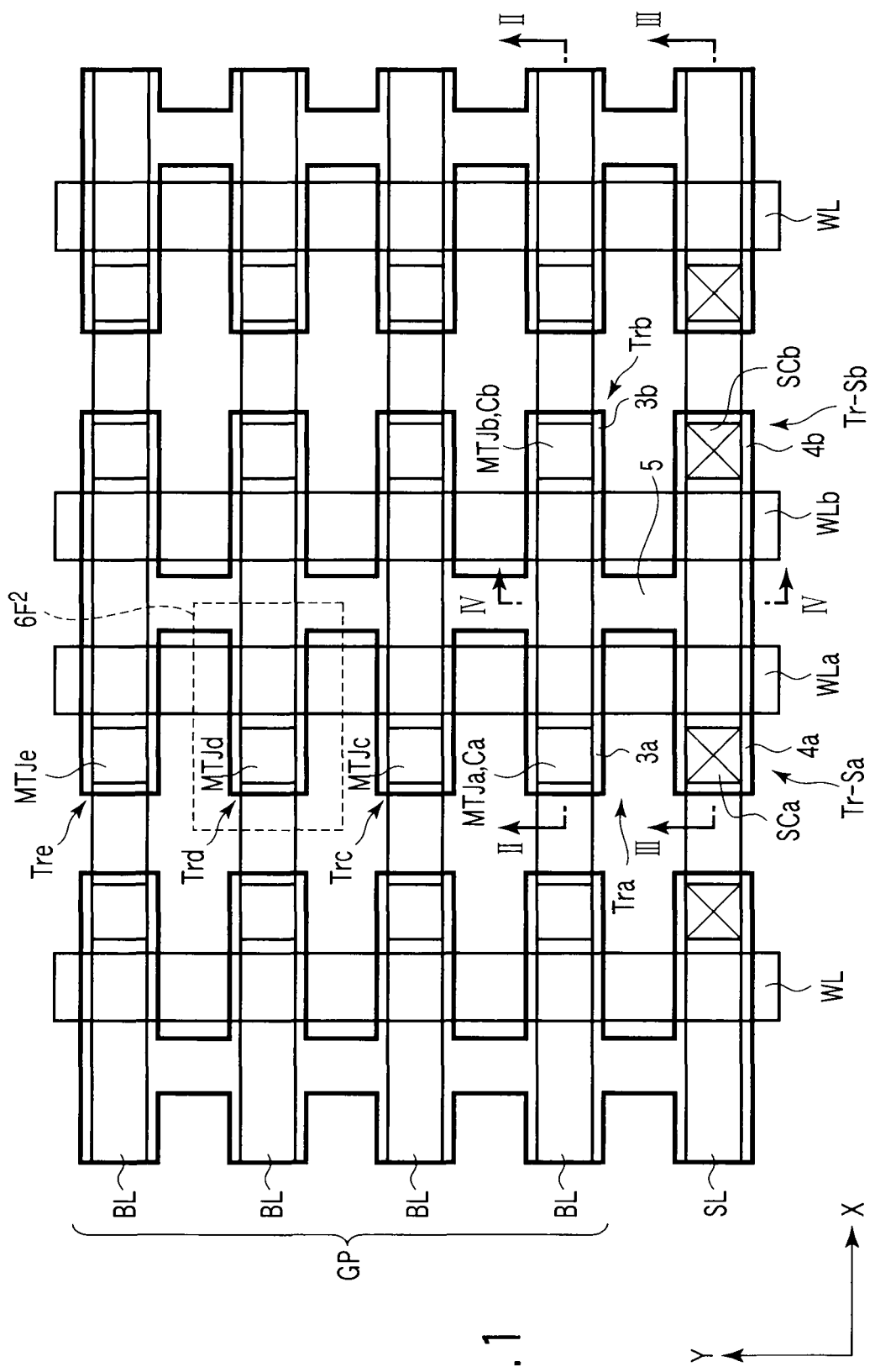
FIG. 1 is a plan view showing the layout of a magnetic random access memory according to the first embodiment of the present invention.

Embodiments of the present invention will be explained below with reference to the accompanying drawing. In the following explanation, the same reference numerals denote the same parts throughout the drawing.

[1] First Embodiment

[1-1] Layout

FIG. 1 is a plan view of the layout of a magnetic random access memory according to the first embodiment of the present invention. The layout of the magnetic random access memory according to the first embodiment will be explained below.

As shown in FIG. 1, four bit lines BL run apart from each other in the X direction, and four word lines WL run apart from each other in the Y direction (perpendicular to the X direction). A source line SL runs in the X direction. In this embodiment, therefore, the source line SL is paired with a group GP of the four bit lines BL. The source line SL and bit lines BL run in the same interconnection layer in the same direction. The source line SL is formed along the end of the group GP of the four bit lines BL.

Cells adjacent to an MTJ element MTJa in the Y direction are connected as follows. In the first cell, the MTJ element MTJa and a transistor Tra corresponding to it are connected in series. In the second cell, an MTJ element MTJc and a transistor Trc corresponding to it are connected in series. In the third cell, an MTJ element MTJd and a transistor Trd corresponding to it are connected in series. In the fourth cell, an MTJ element MTJe and a transistor Tre corresponding to it are connected in series. The first to fourth cells are connected in parallel to adjacent cells. A source/drain diffusion layer 5 shared by the transistors Tra, Trc, Trd, and Tre extends from the bit line BL of the fourth cell to the source line SL. Accordingly, the first to fourth cells connected in parallel to adjacent cells are connected to the common source line SL by using the source/drain diffusion layer 5.

A source contact SCa connecting the source/drain diffusion layer 5 and source line SL is aligned with the MTJ elements MTJa, MTJc, MTJd, and MTJe in the Y direction. That is, all the source contact SCa and MTJ elements MTJa, MTJc, MTJd, and MTJe are arranged on the first side (the left side of the drawing surface) of a word line WLa.

Next, the layout of each cell will be explained in detail below by taking the MTJ element MTJa and an MTJ element MTJb corresponding to the bit line BL closest to the source line SL as examples.

The MTJ element MTJa is formed below the bit line BL on the first side (the left side of the drawing surface) of the word line WLa, and connected to the bit line BL. A contact Ca is formed below the MTJ element MTJa.

The transistor (e.g., a MOS transistor) Tra is connected in series with the MTJ element MTJa. The transistor Tra has a gate electrode, a source/drain diffusion layer 3a, and the source/drain diffusion layer 5. The gate electrode is made of the word line WLa. The source/drain diffusion layer 3a is formed in a semiconductor substrate below the contact Ca, and connected to the MTJ element MTJa via the contact Ca. The source/drain diffusion layer 5 is formed in the semiconductor substrate from a portion below the bit line BL on the second side (the right side of the drawing surface) of the word line WLa to a portion below the source line SL on the second side (the right side of the drawing surface) of the word line WLa.

The source contact SCa is formed below the source line SL on the first side (the left side of the drawing surface) of the word line WLa, and connected to the source line SL.

A transistor (e.g., a MOS transistor) Tr-Sa is connected in series with the source contact SCa. The transistor Tr-Sa has a gate electrode, a source/drain diffusion layer 4a, and the source/drain diffusion layer 5. The gate electrode is made of the word line WLa. The source/drain diffusion layer 4a is formed in the semiconductor substrate below the source contact SCa, and connected to the source line SL via the source contact SCa.

On the first side (the left side of the drawing surface) of the word line WLa, the source contact SCa, contact Ca, and MTJ element MTJa are aligned in the Y direction, and the source/drain diffusion layers 4a and 3a are also aligned in the Y direction as they are electrically isolated from each other.

On the second side (the right side of the drawing surface) of the word line WLa, the common source/drain diffusion layer 5 continuously extends in the semiconductor substrate in the Y direction from a portion below the source line SL to a portion below the bit line BL.

Accordingly, an electrical path between the MTJ element MTJa and source line SL is formed in the order of contact Ca→source/drain diffusion layer 3a→common source/drain diffusion layer 5→source/drain diffusion layer 4a→source contact SCa→source line SL. Hence, the planar shape of an element region corresponding to the MTJ element MTJa is a U-shape. Therefore, an electric current flows between the source line SL and bit line BL via the two transistors Tr-Sa and Tra.

The MTJ element MTJb is formed below the bit line BL on the first side (the right side of the drawing surface) of a word line WLb, and connected to the bit line BL. A contact Cb is formed below the MTJ element MTJb.

A transistor (e.g., a MOS transistor) Trb is connected in series with the MTJ element MTJb. The transistor Trb has a gate electrode, a source/drain diffusion layer 3b, and the source/drain diffusion layer 5. The gate electrode is made of the word line WLb. The source/drain diffusion layer 3b is formed in the semiconductor substrate below a contact Cb, and connected to the MTJ element MTJb via the contact Cb.

A source contact SCb is formed below the source line SL on the first side (the right side of the drawing surface) of the word line WLb, and connected to the source line SL.

A transistor (e.g., a MOS transistor) Tr-Sb is connected in series with the source contact SCb. The transistor Tr-Sb has a gate electrode, a source/drain diffusion layer 4b, and the source/drain diffusion layer 5. The gate electrode is made of the word line WLb. The source/drain diffusion layer 4b is formed in the semiconductor substrate below the source contact SCb, and connected to the source line SL via the source contact SCb. The transistors Tr-Sa, Tr-Sb, Tra, and Trb share the source/drain diffusion layer 5.

On the first side (the right side of the drawing surface) of the word line WLb, the source contact SCb, contact Cb, and MTJ element MTJb are aligned in the Y direction, and the source/drain diffusion layers 4b and 3b are also aligned in the Y direction as they are electrically isolated from each other.

On the second side (the left side of the drawing surface) of the word line WLb, the common source/drain diffusion layer 5 continuously extends in the semiconductor substrate in the Y direction from a portion below the source line SL to a portion below the bit line BL.

Accordingly, an electrical path between the MTJ element MTJb and source line SL is formed in the order of contact Cb source/drain diffusion layer 3b→common source/drain diffusion layer 5→source/drain diffusion layer 4b→source contact SCb→source line SL. Hence, the planar shape of an element region corresponding to the MTJ element MTJb is a U-shape. Therefore, an electric current flows between the source line SL and bit line BL via the two transistors Tr-Sb and Trb.

[1-2] Sectional Structure

FIG. 2 is a sectional view taken along a line II-II in FIG. 1. FIG. 3 is a sectional view taken along a line III-III in FIG. 1. FIG. 4 is a sectional view taken along a line IV-IV in FIG. 1. The sectional structure of the magnetic random access memory according to the first embodiment will be explained below.

FIG. 2 is a sectional view in the X direction of a region where the bit line BL exists. As shown in FIG. 2, an element isolation insulating film 2 having an STI (Shallow Trench Isolation) structure is formed in a semiconductor substrate (silicon substrate) 1. A gate electrode is formed on a gate insulating film (not shown) on the semiconductor substrate 1.

This gate electrode is made of the word line WLa. The source/drain diffusion layer 3a and common source/drain diffusion layer 5 are formed in the semiconductor substrate 1 on the two sides of the word line WLa below the bit line BL. The contact Ca is formed on the source/drain diffusion layer 3a, and the MTJ element MTJa is formed on the contact Ca. An upper electrode 6 is formed on the MTJ element MTJa, and the bit line BL is formed on the upper electrode 6. The bit line BL is connected to, e.g., a power supply terminal or ground terminal.

FIG. 3 is a sectional view in the X direction of a region where the source line SL exists. As shown in FIG. 3, the source/drain diffusion layer 4a and common source/drain diffusion layer 5 are formed in the semiconductor substrate 1 on the two sides of the word line WLa below the source line SL. The source contact SCa is formed on the source/drain diffusion layer 4a, and the source line SL is formed on the source contact SCa. The source line SL is connected to, e.g., a power supply terminal or ground terminal.

FIG. 4 is a sectional view in the Y direction of a region where the common source/drain diffusion layer 5 exists. As shown in FIG. 4, the common source/drain diffusion layer 5 continuously extends, without being electrically disconnected, in the semiconductor substrate 1 from a portion below the bit line BL to a portion below the source line SL. The bit line BL and source line SL are arranged in the same interconnection layer.

[1-3] Effects

In the first embodiment described above, source lines SL are not formed between bit lines BL such that the source lines SL and bit lines BL are equal in number, but one source line SL is formed along the end of each group GP including, e.g., four bit lines. Since the source line SL need not be formed between the bit lines BL in the group GP, the spacing between the bit lines BL can be decreased to, e.g., the minimum feature size (F). This makes it possible to decrease the cell size to about 6 $F^2$.

Also, the source line SL and bit lines BL can be formed by the same interconnection layer. Therefore, two metal interconnection layers can be reduced compared to the case where the source line SL and bit lines BL are formed by different interconnection layers.

Furthermore, all the source contact SCa and MTJ elements MTJa, MTJc, MTJd, and MTJe are arranged on the left side of the word line WLa on the drawing surface. Since the source contact SCa is not formed between the word lines WLa and WLb, the distance between the word lines WLa and WLb can be shortened. This makes it possible to further decrease the cell size.

Note that although the four bit lines BL form one group GP in this embodiment, the number of the bit lines BL is not limited to four. Since, however, all unselected bit lines must be charged to a predetermined potential in a write cycle, it should be noted that the larger the number of the bit lines BL in one group GP, the lower the operating speed.

[2] Second Embodiment

The second embodiment is a modification of the first embodiment, in which each cell is connected to a common source line by using not only a diffusion layer but also a metal interconnection. Note that an explanation of the same features as in other embodiments will not be repeated in this embodiment.

[2-1] Layout

Figure 5:
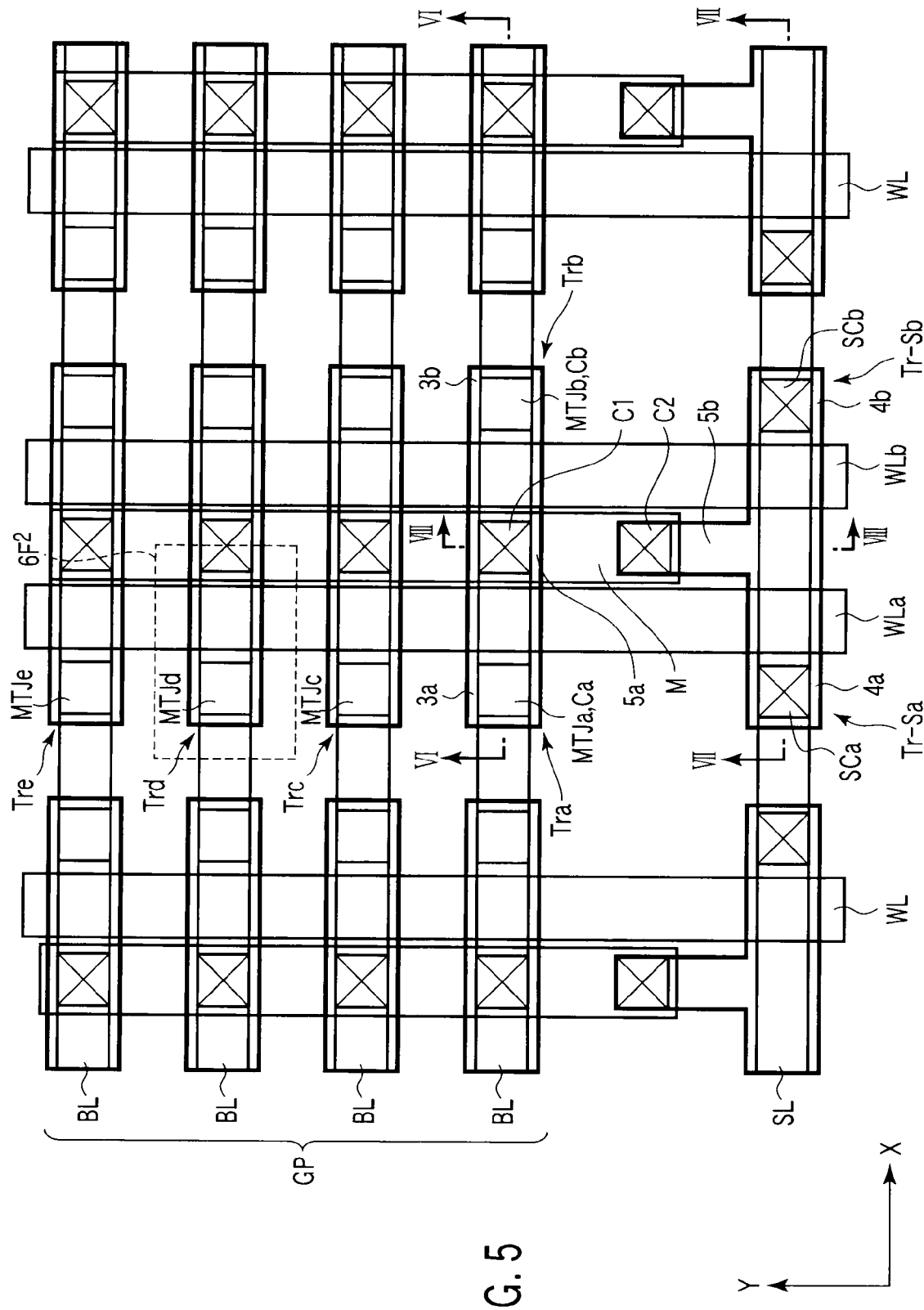
FIG. 5 is a plan view showing the layout of a magnetic random access memory according to the second embodiment of the present invention.

FIG. 5 is a plan view of the layout of a magnetic random access memory according to the second embodiment of the present invention. The layout of the magnetic random access memory according to the second embodiment will be explained below.

In the second embodiment as shown in FIG. 5, the planar shapes of element regions corresponding to MTJ elements MTJa and MTJb are U-shapes as in the first embodiment. However, the second embodiment differs from the first embodiment in the structure of an electrical path between word lines WLa and WLb.

Source/drain diffusion layers 5a and 5b, an interconnection M, and contacts C1 and C2 are arranged between the word lines WLa and WLb (on the right side of the word line WLa and on the left side of the word line WLb on the drawing surface). Transistors Tra, Trb, Tr-Sa, and Tr-Sb share the source/drain diffusion layers 5a and 5b, interconnection M, and contacts C1 and C2.

The source/drain diffusion layer 5a is formed in only a semiconductor substrate below a bit line BL between the word lines WLa and WLb. The source/drain diffusion layer Sb extends in the semiconductor substrate in the Y direction from a portion below a source line SL between the word lines WLa and WLb to a portion between the bit line BL and source line SL. The source/drain diffusion layers 5a and Sb are aligned in the Y direction as they are electrically isolated from each other.

The interconnection M is formed between the word lines WLa and WLb, and runs in the Y direction from a portion below the bit line BL to a portion between the bit line BL and source line SL. The interconnection M is not in direct contact with the source line SL, but electrically connected to the source line SL via the contact C2, the source/drain diffusion layer Sb, source/drain diffusion layers 4a and 4b, and source contacts SCa and SCb.

The contact C1 is formed below the bit line BL between the word lines WLa and WLb, and connects the interconnection M to the source/drain diffusion layer 5a. The contact C2 is formed between the source line SL and bit line BL between the word lines WLa and WLb, and connects the interconnection M to the source/drain diffusion layer Sb.

[2-2] Sectional Structure

Figure 6:
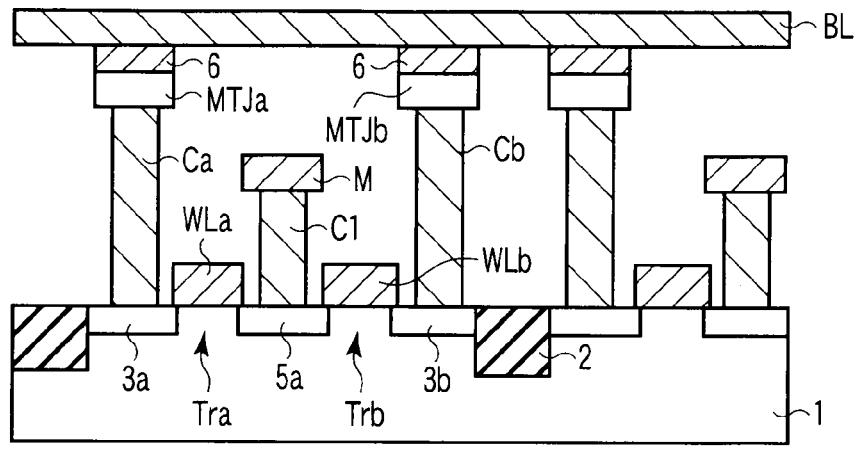
FIG. 6 is a sectional view taken along a line VI-VI in FIG. 5.
Figure 7:
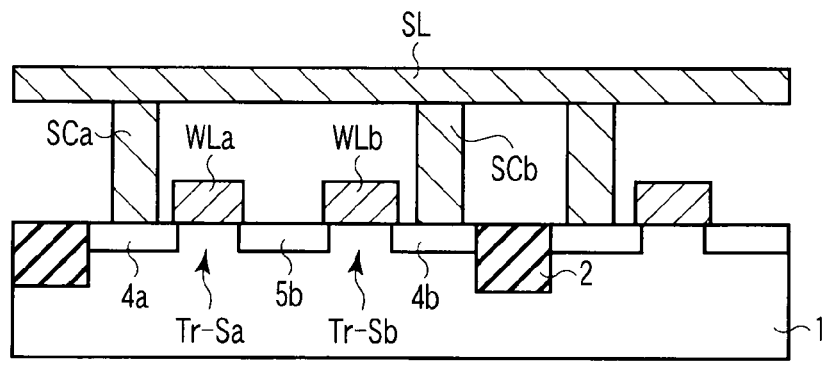
FIG. 7 is a sectional view taken along a line VII-VII in FIG. 5.
Figure 8:
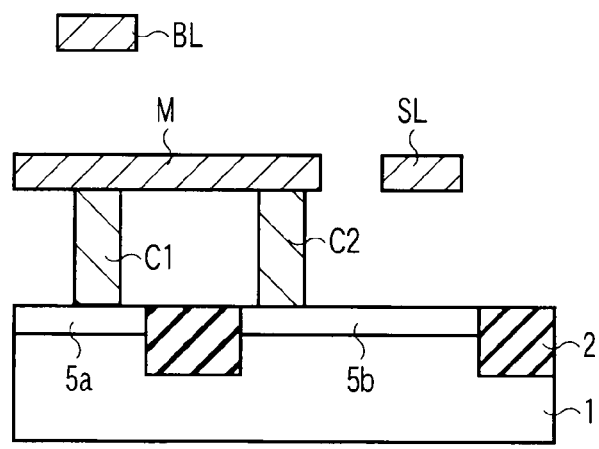
FIG. 8 is a sectional view taken along a line VIII-VIII in FIG. 5.

FIG. 6 is a sectional view taken along a line VI-VI in FIG. 5. FIG. 7 is a sectional view taken along a line VII-VII in FIG. 5. FIG. 8 is a sectional view taken along a line VIII-VIII in FIG. 5. The sectional structure of the magnetic random access memory according to the second embodiment will be explained below.

FIG. 6 is a sectional view in the X direction of a region where the bit line BL exists. As shown in FIG. 6, a source/drain diffusion layer 3a and the source/drain diffusion layer 5a are formed in a semiconductor substrate 1 on the two sides of the word line WLa below the bit line BL. The contact C1 is formed on the source/drain diffusion layer 5a, and the interconnection M is formed on the contact C1.

FIG. 7 is a sectional view in the X direction of a region where the source line SL exists. As shown in FIG. 7, the source/drain diffusion layers 4a and 5b are formed in the semiconductor substrate 1 on the two sides of the word line WLa below the source line SL.

FIG. 8 is a sectional view in the Y direction of a region where the source/drain diffusion layers 5a and Sb exist. As shown in FIG. 8, the source/drain diffusion layer 5a is formed in the semiconductor substrate 1 below the bit line BL. The source/drain diffusion layer 5b is formed in the semiconductor substrate 1 from a portion below the source line SL to a portion between the source line SL and bit line BL. The contact C1 is formed below the bit line BL, and connects the interconnection M to the source/drain diffusion layer 5a. The contact C2 is formed between the source line SL and bit line BL, and connects the interconnection M to the source/drain diffusion layer 5b.

The source/drain diffusion layers 5a and 5b are not in direct contact with each other because an element isolation insulating film 2 exists between them. However, the source/drain diffusion layers 5a and 5b are electrically connected via the contacts C1 and C2 and interconnection M.

The word lines WL and interconnection M are formed below the bit lines BL, and hence are arranged in an interconnection layer different from that of the bit lines BL. The word lines WL and interconnection M are formed in the same interconnection layer.

[2-3] Effects

The second embodiment described above can decrease the cell size by forming the source line SL for each group GP including a plurality of bit lines as in the first embodiment.

In addition, the second embodiment uses not only the diffusion layers 5a and 5b but also the interconnection M to connect each cell to the common source line SL. This makes it possible to reduce the parasitic resistance in the element region.

[3] Third Embodiment

In the first and second embodiments, an electric current from the common source line flows to the cell transistor Tra via the transistor Tr-Sa of the source line. In the third embodiment, however, an electric current from a common source line flows to a cell transistor Tra without passing through any transistor of the source line. Note that an explanation of the same features as in other embodiments will not be repeated in this embodiment.

[3-1] Layout

Figure 9:
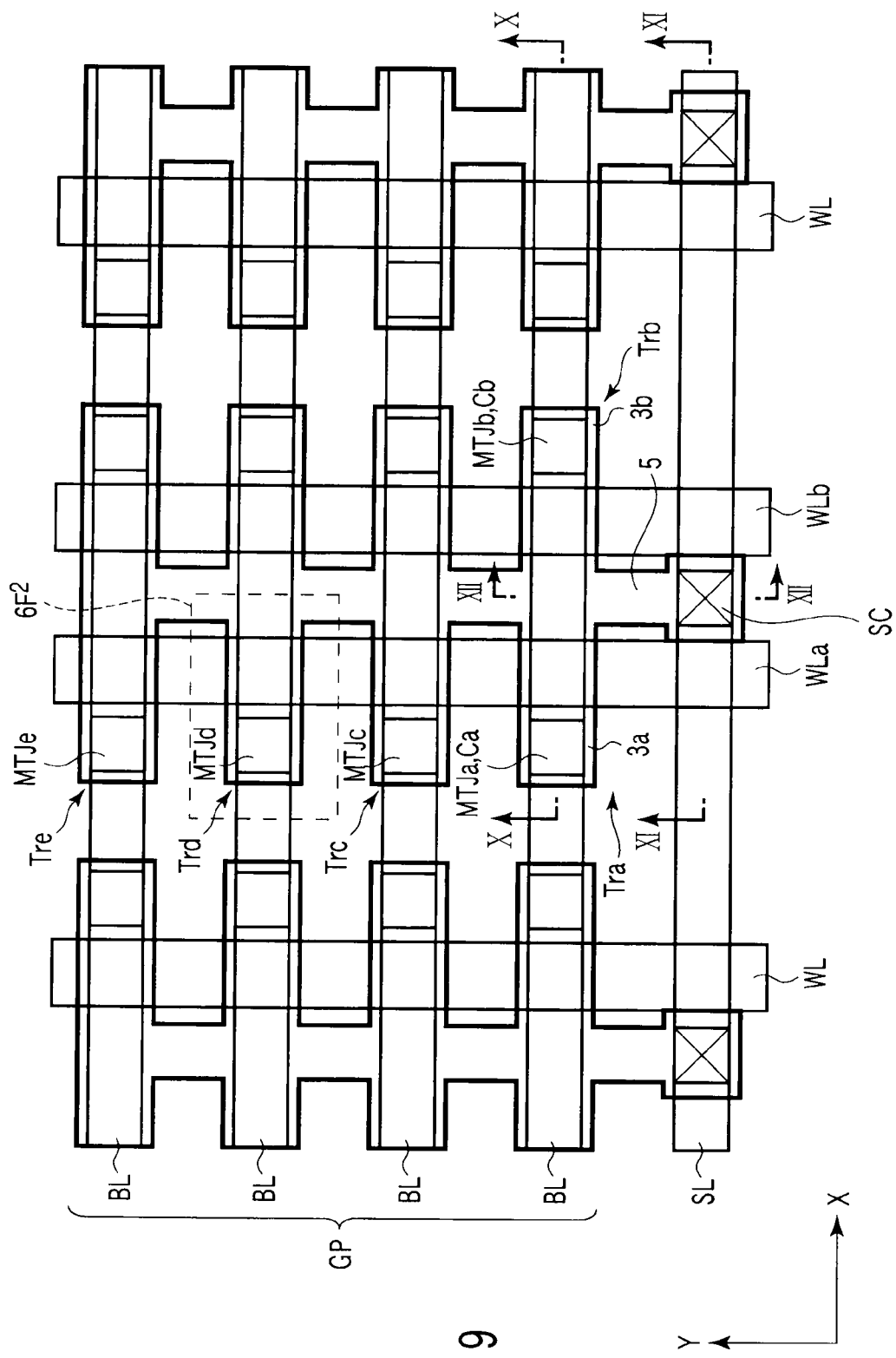
FIG. 9 is a plan view showing the layout of a magnetic random access memory according to the third embodiment of the present invention.

FIG. 9 is a plan view of the layout of a magnetic random access memory according to the third embodiment of the present invention. The layout of the magnetic random access memory according to the third embodiment will be explained below.

In the third embodiment as shown in FIG. 9, a source contact SC is formed between word lines WLa and WLb (on the right side of the word line WLa and on the left side of the word line WLb on the drawing surface). The source contact SC is positioned below a source line SL between the word lines WLa and WLb, and connected to the source line SL. Between the word lines WLa and WLb, a source/drain diffusion layer 5 is formed in a semiconductor substrate in the Y direction from a portion below the source contact SC to a portion below a bit line BL, and connected to the source contact SC. Transistors Tra and Trb share the source/drain diffusion layer 5.

In this embodiment, an electrical path between an MTJ element MTJa and the source line SL is formed in the order of contact Ca→source/drain diffusion layer 3a→source/drain diffusion layer 5→source contact SC→source line SL. That is, an electric current flows between the source line SL and bit line BL by passing through only the transistor Tra. Therefore, the planar shape of an element region corresponding to the MTJ element MTJa is an L-shape.

Similarly, an electrical path between an MTJ element MTJb and the source line SL is formed in the order of drain contact DCb→drain diffusion layer Db→source/drain diffusion layer 5→source contact SC→source line SL. That is, an electric current flows between the source line SL and bit line BL by passing through only the transistor Trb. Accordingly, the planar shape of an element region corresponding to the MTJ element MTJb is an L-shape.

[3-2] Sectional Structure

Figure 10:
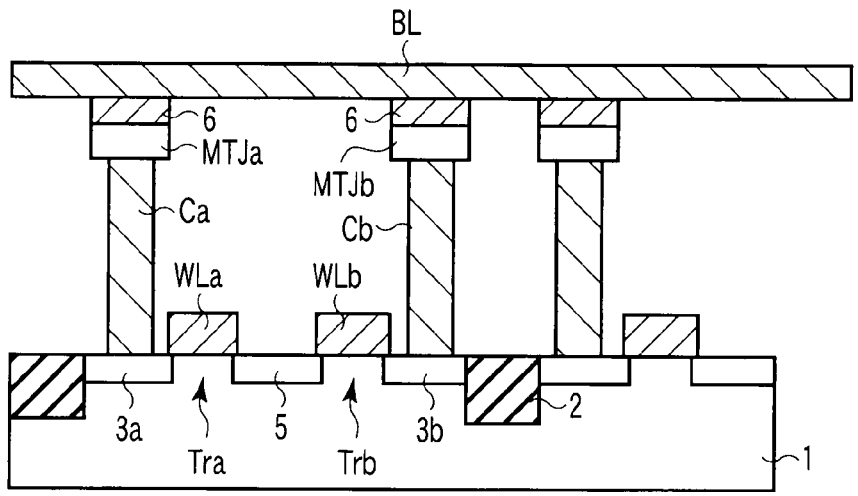
FIG. 10 is a sectional view taken along a line X-X in FIG. 9.
Figure 11:
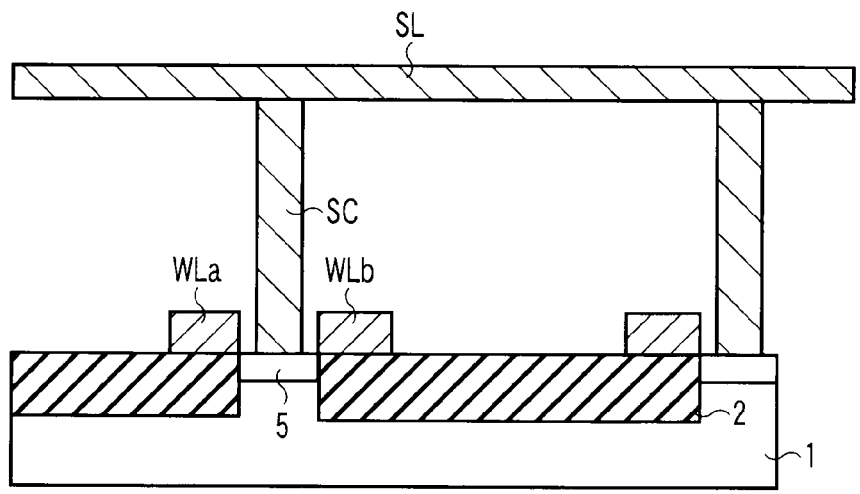
FIG. 11 is a sectional view taken along a line XI-XI in FIG. 9.
Figure 12:
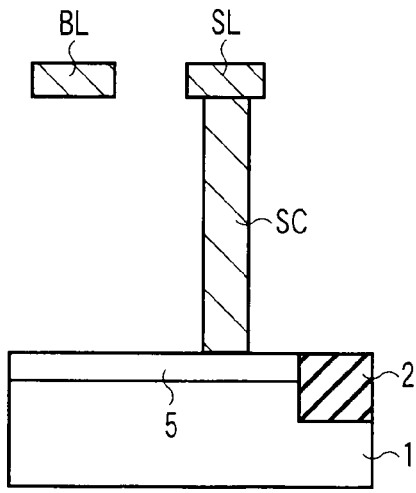
FIG. 12 is a sectional view taken along a line XII-XII in FIG. 9.

FIG. 10 is a sectional view taken along a line X-X in FIG. 9. FIG. 11 is a sectional view taken along a line XI-XI in FIG. 9. FIG. 12 is a sectional view taken along a line XII-XII in FIG. 9. The sectional structure of the magnetic random access memory according to the third embodiment will be explained below.

FIG. 10 is a sectional view in the X direction of a region where the bit line BL exists. As shown in FIG. 10, the source/drain diffusion layers 3a and 5 are formed in a semiconductor substrate 1 on the two sides of the word line WLa below the bit line BL.

FIG. 11 is a sectional view in the X direction of a region where the source line SL exists. As shown in FIG. 11, the source/drain diffusion layer 5 is formed in the semiconductor substrate 1 between the word lines WLa and WLb below the source line SL. The source contact SC is formed on the source/drain diffusion layer 5, and the source line SL is formed on the source contact SC. An element isolation insulating film 2 is formed in the semiconductor substrate 1 below the word lines WLa and WLb below the source line SL.

FIG. 12 is a sectional view in the Y direction of a region where the source/drain diffusion layer 5 exists. As shown in FIG. 12, the source/drain diffusion layer 5 continuously extends, without being electrically disconnected, in the semiconductor substrate 1 from a portion below the bit line BL to a portion below the source line SL. The source/drain diffusion layer 5 and source line SL are connected by the source contact SC formed below the source line SL. The bit line BL and source line SL are arranged in the same interconnection layer.

[3-3] Effects

The third embodiment described above can decrease the cell size by forming the source line SL for each group GP including a plurality of bit lines as in the first embodiment.

Also, the source line SL and bit lines BL can be formed by the same interconnection layer as in the first embodiment. Therefore, two metal interconnection layers can be reduced compared to the case where the source line SL and bit lines BL are formed by different interconnection layers.

Furthermore, in the third embodiment, an electric current from the common source line SL directly flows to the cell transistors Tra and Trb without passing through any transistor of the source line. Accordingly, a voltage drop caused by any transistor has no influence on operations.

[4] Fourth Embodiment

The fourth embodiment is a modification of the third embodiment, in which each cell is connected to a common source line by extending the source line to the cell. Note that an explanation of the same features as in other embodiments will not be repeated in this embodiment.

[4-1] Layout

Figure 13:
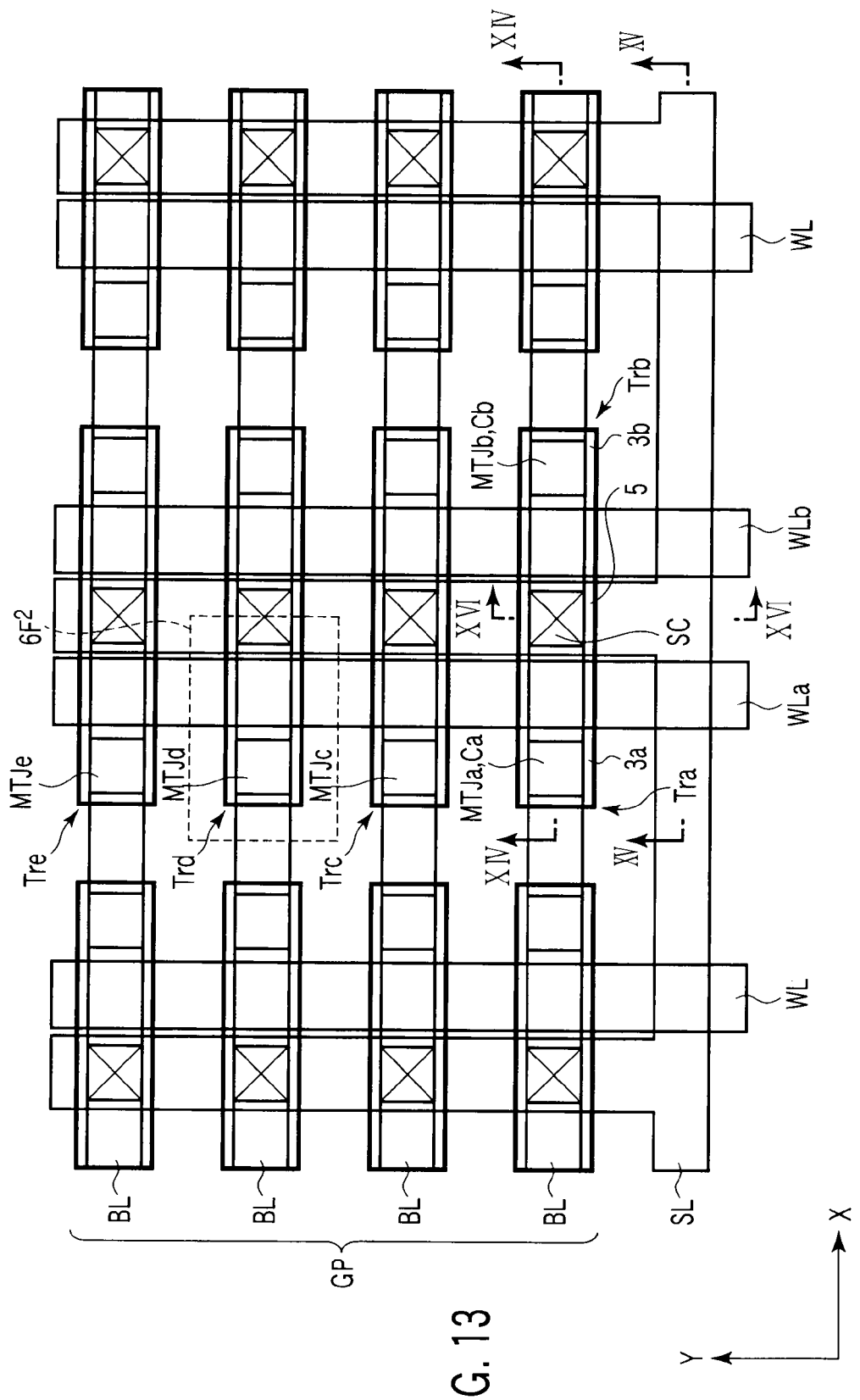
FIG. 13 is a plan view showing the layout of a magnetic random access memory according to the fourth embodiment of the present invention.

FIG. 13 is a plan view of the layout of a magnetic random access memory according to the fourth embodiment of the present invention. The layout of the magnetic random access memory according to the fourth embodiment will be explained below.

In the fourth embodiment as shown in FIG. 13, a source line SL has a first portion extending in the X direction apart from a bit line BL, and a second portion extending in the Y direction between word lines WLa and WLb. The second portion of the source line SL is extended to a portion above a source contact SC and connected to the source contact SC.

At the intersection of the second portion of the source line SL and the bit line BL, the source contact SC is formed below the bit line BL between the word lines WLa and WLb (on the right side of the word line WLa and on the left side of the word line WLb on the drawing surface). A source/drain diffusion layer 5 shared by transistors Tra and Trb is formed in a semiconductor substrate below the source contact SC.

In this embodiment, an electrical path between an MTJ element MTJa and the source line SL is formed in the order of contact Ca→source/drain diffusion layer 3a→source/drain diffusion layer 5→source contact SC→source line SL. Therefore, the planar shape of an element region corresponding to the MTJ element MTJa is an I-shape.

Likewise, an electrical path between an MTJ element MTJb and the source line SL is formed in the order of contact Cb→source/drain diffusion layer 3b→source/drain diffusion layer 5→source contact SC→source line SL. Accordingly, the planar shape of an element region corresponding to the MTJ element MTJb is an I-shape.

In the fourth embodiment, therefore, as in the third embodiment, an electric current from the common source line SL flows to the cell transistors Tra and Trb without passing through any transistor of the source line SL.

[4-2] Sectional Structure

FIG. 14 is a sectional view taken along a line XIV-XIV in FIG. 13. FIG. 15 is a sectional view taken along a line XV-XV in FIG. 13. FIG. 16 is a sectional view taken along a line XVI-XVI in FIG. 13. The sectional structure of the magnetic random access memory according to the fourth embodiment will be explained below.

FIG. 14 is a sectional view in the X direction of a region where the bit line BL exists. As shown in FIG. 14, the source/drain diffusion layers 3a and 5 are formed in a semiconductor substrate 1 on the two sides of the word line WLa below the bit line BL.

FIG. 15 is a sectional view in the X direction of a region where the first portion of the source line SL exists. As shown in FIG. 15, an element isolation insulating film 2 is formed in the semiconductor substrate 1 below the first portion of the source line SL.

FIG. 16 is a sectional view in the Y direction of a region where the source/drain diffusion layer 5 exists. As shown in FIG. 16, the source/drain diffusion layer 5 is formed in the semiconductor substrate 1 below the bit line BL. The source/drain diffusion layer 5 and source line SL are connected by the source contact SC formed below the second portion of the source line SL. Also, the source line SL is formed below the bit line BL, and hence placed in an interconnection layer different from that of the bit line BL.

[4-3] Effects

The fourth embodiment described above can decrease the cell size by forming the source line SL for each group GP including a plurality of bit lines as in the first embodiment.

Also, in the fourth embodiment, the source line SL has the second portion formed by extending the source line SL to each cell. Accordingly, the parasitic resistance in the element region can be reduced because each cell is connected to the common source line SL by using its second portion. Furthermore, an electric current from the common source line SL directly flows to the cell transistors Tra and Trb without passing through any transistor of the source line SL. Therefore, a voltage drop caused by any transistor has no influence on operations.

[5] Fifth Embodiment

The fifth embodiment is a modification of the first embodiment, in which a common source line is formed in the center of a group GP of four bit lines BL. Note that an explanation of the same features as in other embodiments will not be repeated in this embodiment.

[5-1] Layout

Figure 17:
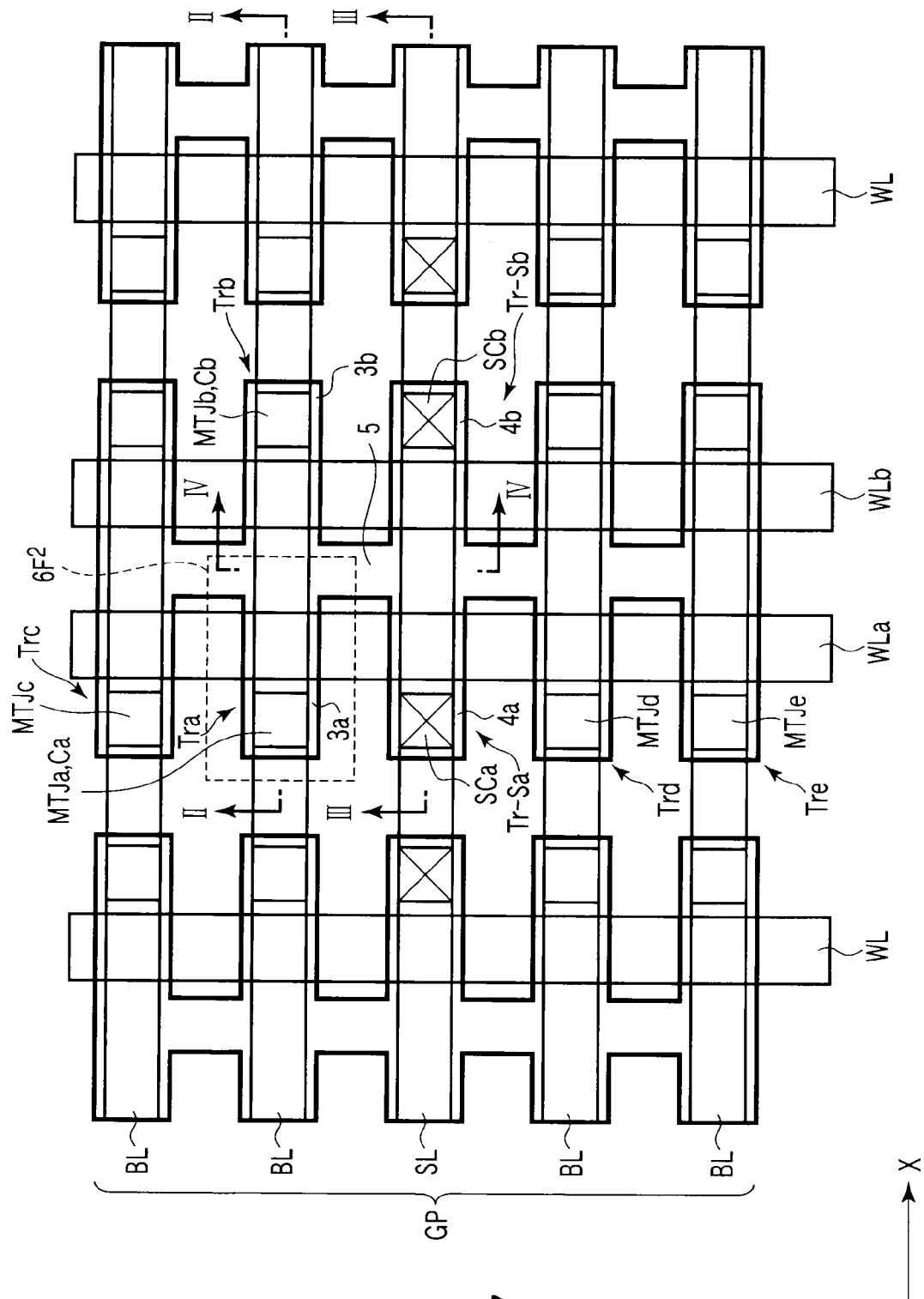
FIG. 17 is a plan view showing the layout of a magnetic random access memory according to the fifth embodiment of the present invention.

FIG. 17 is a plan view of the layout of a magnetic random access memory according to the fifth embodiment of the present invention. The layout of the magnetic random access memory according to the fifth embodiment will be explained below.

As shown in FIG. 17, the fifth embodiment differs from the first embodiment in that a common source line SL is formed in, e.g., the center of the group GP of the four bit lines BL.

Note that the source line SL need not always be positioned in the center of the group GP, but can also be placed in any position between the bit lines BL in the group GP.

[5-2] Sectional Structure

The sectional structure of this embodiment is the same as that shown in FIGS. 2 to 4, so a repetitive explanation will be omitted.

[5-3] Effects

The fifth embodiment described above can decrease the cell size by forming the source line SL for each group GP including a plurality of bit lines as in the first embodiment.

Also, the source line SL and bit lines BL can be formed by the same interconnection layer as in the first embodiment. Therefore, two metal interconnection layers can be reduced compared to the case where the source line SL and bit lines BL are formed by different interconnection layers.

In addition, as in the first embodiment, all of a source contact SCa and MTJ elements MTJa, MTJc, MTJd, and MTJe are arranged on the left side of a word line WLa on the drawing surface. Since the source contact SCa is not formed between the word line WLa and a word line WLb, the distance between the word lines WLa and WLb can be shortened. This makes it possible to further decrease the cell size.

Furthermore, the fifth embodiment can reduce the parasitic resistance in the element region more than in the first embodiment by forming the common source line SL in the center of the group GP of the four bit lines BL.

[6] MTJ Elements

MTJ elements used in each of the above embodiments will be explained below.

FIGS. 18A and 18B are sectional views of a parallel magnetization type MTJ element according to each embodiment of the present invention. FIGS. 19A and 19B are sectional views of a perpendicular magnetization type MTJ element according to each embodiment of the present invention. The MTJ elements according to each embodiment will be explained below.

As shown in FIGS. 18A, 18B, 19A, and 19B, an MTJ element MTJ has a fixed layer (pinned layer) 11 in which the magnetization direction is fixed, a recording layer (free layer) 13 in which the magnetization direction can reverse, and a nonmagnetic layer 12 formed between the fixed layer 11 and recording layer 13.

In the MTJ element MTJ as described above, the magnetization directions in the fixed layer 11 and recording layer 13 take a parallel state or antiparallel state in accordance with the direction of an electric current flowing between the fixed layer 11 and recording layer 13. The magnetization in the recording layer 13 reverses when an electric current exceeding the reversing current threshold value flows.

The magnetization directions in the fixed layer 11 and recording layer 13 of the MTJ element MTJ can be parallel to the film surface (a parallel magnetization type) as shown in FIGS. 18A and 18B, or perpendicular to the film surface (a perpendicular magnetization type) as shown in FIGS. 19A and 19B. Note that the perpendicular magnetization type MTJ element MTJ has the advantage that the longitudinal direction of the element shape does not determine the magnetization direction.

Examples of the materials of the MTJ element MTJ are as follows.

As the material of the fixed layer 11 and recording layer 13, it is favorable to use any of Fe, Co, Ni, alloys of these metals, magnetite having a high spin polarization ratio, oxides such as $CrO_2$ and $RXMnO_{3-y}$ (R; a rare earth element, and X; Ca, Ba, or Sr), and Heusler alloys such as NiMnSb and PtMnSb. These magnetic materials may also contain more or less nonmagnetic elements such as Ag, Cu, Au, Al, Mg, Si, Bi, Ta, B, C, O, N, Pd, Pt, Zr, Ir, W, Mo, and Nb, provided that the materials do not lose their ferromagnetism.

As the material of the nonmagnetic layer 12, it is possible to use any of various dielectric materials such as $Al_2O_3$, $SiO_2$, MgO, AlN, $Bi_2O_3$, $MgF_2$, $CaF_2$, $SrTiO_2$, and $AlLaO_3$. Oxygen, nitrogen, and fluorine deficiencies may exist in these dielectric materials.

An antiferromagnetic layer for fixing the magnetization direction in the fixed layer 11 may also be formed on the surface of the fixed layer 11 away from the nonmagnetic layer 12. As the material of this antiferromagnetic layer, it is preferable to use, e.g., Fe—Mn, Pt—Mn, Pt—Cr—Mn, Ni—Mn, Ir—Mn, NiO, or $Fe_2O_3$.

The planar shape of the MTJ element MTJ can be changed to, e.g., a rectangle, square, circle, ellipse, hexagon, rhomb, parallelogram, cross, or bean (recessed shape).

The MTJ element MTJ can have a single-tunnel-junction (single-junction) structure or double-tunnel-junction (double-junction) structure.

As shown in FIGS. 18A, 18B, 19A, and 19B, a single-tunnel-junction MTJ element MTJ has the fixed layer 11, the recording layer 13, and the nonmagnetic layer 12 formed between the fixed layer 11 and recording layer 13. That is, the MTJ element MTJ has one nonmagnetic layer.

A double-tunnel-junction MTJ element MTJ has a first fixed layer, a second fixed layer, a recording layer formed between the first and second fixed layers, a first nonmagnetic layer formed between the first fixed layer and recording layer, and a second nonmagnetic layer formed between the second fixed layer and recording layer. That is, the MTJ element MTJ has two nonmagnetic layers.

The MR (Magneto Resistive) ratio (the change ratio of the resistance of a state "1" to that of a state "0") of the double-tunnel-junction structure deteriorates less than that of the single-tunnel-junction structure when the same external bias is applied, so the double-tunnel-junction structure can operate with a bias higher than that of the single-tunnel-junction structure. That is, the double-tunnel-junction structure is advantageous when reading out information from a cell.

[7] Write Method

The magnetic random access memory according to each embodiment of the present invention writes data by using spin injection magnetization reversal. In the MTJ element MTJ, therefore, the magnetization directions in the fixed layer 11 and recording layer 13 become parallel or antiparallel in accordance with the direction of an electric current I flowing between the fixed layer 11 and recording layer 13. Practical principles are as follows.

When writing data "1", the electric current I is supplied from the fixed layer 11 to the recording layer 13 of the MTJ element MTJ. That is, electrons e are injected from the recording layer 13 to the fixed layer 11. This makes the magnetization directions in the fixed layer 11 and recording layer 13 opposite and antiparallel. A high-resistance state Rap like this is defined as data "1".

On the other hand, when writing data "0", the electric current I is supplied from the recording layer 13 to the fixed layer 11 of the MTJ element MTJ. That is, the electrons e are injected from the fixed layer 11 to the recording layer 13. This makes the magnetization directions in the fixed layer 11 and recording layer 13 equal and parallel. A low-resistance state Rp like this is defined as data "0".

[8] Read Method

The read operation of the magnetic random access memory according to each embodiment of the present invention uses the magnetoresistive effect.

A transistor Tr connected to the MTJ element MTJ of a selected cell is turned on to supply a read current from, e.g., the bit line BL to the source line SL through the MTJ element MTJ. Whether the data is "1" or "0" is discriminated by the resistance value of the MTJ element MTJ read out on the basis of this read current.

As shown in FIGS. 18A and 19A, the resistance value of the MTJ element MTJ is small when the magnetization directions in the fixed layer 11 and recording layer 13 take the parallel state Rp. Accordingly, the data is "0" in the low-resistance state Rp like this.

On the other hand, as shown in FIGS. 18B and 19B, the resistance value of the MTJ element MTJ is large when the magnetization directions in the fixed layer 11 and recording layer 13 take the antiparallel state Rap. Therefore, the data is "1" in the high-resistance state Rap like this.

Note that the read operation can be performed by reading out a current value by applying a constant voltage, or reading out a voltage value by supplying a constant electric current.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
a first bit line and a second bit line;
a source line formed for a group having the first bit line and the second bit line, adjacent to the first bit line, said source line running in a first direction in which the first bit line and the second bit line run but not being arranged between the first bit line and the second bit line, the first and second bit lines and the source line being arranged in a same interconnection level;
a first magnetoresistive effect element connected to the first bit line;
a second magnetoresistive effect element connected to the second bit line;
a first transistor connected in series with the first magnetoresistive effect element; and
a second transistor connected in series with the second magnetoresistive effect element,
wherein a first cell having the first magnetoresistive effect element and the first transistor and a second cell having the second magnetoresistive effect element and the second transistor are connected together to the source line.

2. The memory according to claim 1, wherein the source line is formed in one of an end of the group.

3. The memory according to claim 1, further comprising:
a first word line running in a second direction perpendicular to the first direction;

a first source contact connecting the first cell and the second cell to the source line, and aligned with the first magnetoresistive effect element and the second magnetoresistive effect element in the second direction on a first side of the first word line; and a third transistor connected to the first source contact.

4. The memory according to claim 3, wherein the first transistor has a first gate electrode, a first diffusion layer, and a second diffusion layer, the third transistor has a second gate electrode, a third diffusion layer, and a fourth diffusion layer, the first gate electrode and the second gate electrode are formed by the first word line, the first diffusion layer is formed in a semiconductor substrate below the first magnetoresistive effect element, and connected to the first magnetoresistive effect element, the third diffusion layer is formed in the semiconductor substrate below the first source contact, and connected to the first source contact, and the second diffusion layer and the fourth diffusion layer are made of a common diffusion layer formed in the semiconductor substrate on a second side of the first word line.

5. The memory according to claim 4, wherein the first and second bit lines and the source line do not cross.

6. The memory according to claim 4, further comprising:

a second word line adjacent to the first word line and running in the second direction;

a third magnetoresistive effect element formed below the first bit line on a first side of the second word line, and connected to the first bit line;

a fourth transistor connected in series with the third magnetoresistive effect element;

a second source contact aligned with the third magnetoresistive effect element in the second direction on the first side of the second word line, and connecting a third cell having the third magnetoresistive effect element and the fourth transistor to the source line; and a fifth transistor connected to the second source contact.

7. The memory according to claim 6, wherein the fourth transistor has a third gate electrode, a fifth diffusion layer, and a sixth diffusion layer, the fifth transistor has a fourth gate electrode, a seventh diffusion layer, and an eighth diffusion layer, the third gate electrode and the fourth gate electrode are formed by the second word line, the fifth diffusion layer is formed in the semiconductor substrate below the third magnetoresistive effect element, and connected to the third magnetoresistive effect element, the seventh diffusion layer is formed in the semiconductor substrate below the second source contact, and connected to the second source contact, the sixth diffusion layer and the eighth diffusion layer are formed by the common diffusion layer, and the common diffusion layer is positioned between the first word line and the second word line, and shared by the first transistor, the second transistor, the third transistor, the fourth transistor, and the fifth transistor.

8. The memory according to claim 3, in which the first transistor has a first gate electrode, a first diffusion layer, and a second diffusion layer, the third transistor has a second gate electrode, a third diffusion layer, and a fourth diffusion layer, the first gate electrode and the second gate electrode are formed by the first word line, the first diffusion layer is formed in a semiconductor substrate below the first magnetoresistive effect element, and connected to the first magnetoresistive effect element, the second diffusion layer is formed in only the semiconductor substrate below the first bit line on a second side of the first word line, the third diffusion layer is formed in the semiconductor substrate below the first source contact, and connected to the first source contact, and the fourth diffusion layer extends in the semiconductor substrate in the second direction from a portion below the source line on the second side of the first word line to a portion between the first bit line and the source line, and which further comprises:

an interconnection formed on the second side of the first word line, and running in the second direction from a portion below the first bit line to a portion between the first bit line and the source line;

a first contact connecting the interconnection and the second diffusion layer; and a second contact connecting the interconnection and the fourth diffusion layer.

9. The memory according to claim 8, wherein the first and second bit lines and the source line do not cross.

10. The memory according to claim 8, wherein the source line and the interconnection are arranged in the same interconnection layer.

11. The memory according to claim 8, further comprising:

a second word line adjacent to the first word line and running in the second direction;

a third magnetoresistive effect element formed below the first bit line on a first side of the second word line, and connected to the first bit line;

a fourth transistor connected in series with the third magnetoresistive effect element;

a second source contact aligned with the third magnetoresistive effect element in the second direction on the first side of the second word line, and connecting a third cell having the third magnetoresistive effect element and the fourth transistor to the source line; and a fifth transistor connected to the second source contact.

12. The memory according to claim 11, wherein the fourth transistor has a third gate electrode, a fifth diffusion layer, and a sixth diffusion layer, the fifth transistor has a fourth gate electrode, a seventh diffusion layer, and an eighth diffusion layer, the third gate electrode and the fourth gate electrode are formed by the second word line, the fifth diffusion layer is formed in the semiconductor substrate below the third magnetoresistive effect element, and connected to the third magnetoresistive effect element, the sixth diffusion layer is formed by a first common diffusion layer together with the second diffusion layer, the seventh diffusion layer is formed in the semiconductor substrate below the second source contact, and connected to the second source contact, the eighth diffusion layer is formed by a second common diffusion layer together with the fourth diffusion layer, and the interconnection, the first common diffusion layer, the second common diffusion layer, the first contact, and the second contact are positioned between the first word line and the second word line, and shared by the first transistor, the second transistor, the third transistor, the fourth transistor, and the fifth transistor.

13. The memory according to claim 1, which further comprises:
a first word line running in a second direction perpendicular to the first direction; and
a source contact formed below the source line on a second side of the first word line, and
in which the first transistor has a first gate electrode, a first diffusion layer, and a second diffusion layer,
the first gate electrode is formed by the first word line,
the first diffusion layer is formed in a semiconductor substrate below the first magnetoresistive effect element on a first side of the first word line, and connected to the first magnetoresistive effect element, and
the second diffusion layer is formed to extend in the semiconductor substrate in the second direction from a portion below the first bit line on the second side of the first word line to a portion below the source line on the second side of the first word line, and connected to the source line by the source contact.

14. The memory according to claim 13, wherein the first and second bit lines and the source line do not cross.

15. The memory according to claim 13, which further comprises:
a second word line adjacent to the first word line and running in the second direction;
a third magnetoresistive effect element formed below the first bit line on a first side of the second word line, and connected to the first bit line; and
a third transistor having a second gate electrode, a third diffusion layer, and a fourth diffusion layer, the second gate electrode being formed by the second word line, the third diffusion layer being formed in the semiconductor substrate below the second magnetoresistive effect element and connected to the second magnetoresistive effect element, and the fourth diffusion layer being the same as the second diffusion layer, and
in which the second diffusion layer and the fourth diffusion layer are positioned between the first word line and the second word line, and shared by the first transistor, the second transistor, and the third transistor.

16. The memory according to claim 1, which further comprises a first word line running in a second direction perpendicular to the first direction, and
in which the source line has a first portion running in the first direction, and a second portion running in the second direction on a first side of the first word line, and
the first cell and the second cell are connected to the second portion of the source line.

17. The memory according to claim 16, in which
the first transistor has a first gate electrode, a first diffusion layer, and a second diffusion layer,
the first gate electrode is formed by the first word line,
the first diffusion layer is formed in a semiconductor substrate below the first magnetoresistive effect element on a second side of the first word line, and connected to the first magnetoresistive effect element, and
the second diffusion layer is formed in the semiconductor substrate below the first bit line on the first side of the first word line, and
which further comprises a source contact formed at an intersection of the first bit line and the second portion of the source line, and connecting the second portion of the source line to the second diffusion layer.

18. The memory according to claim 17, wherein the first and second bit lines and the source line do not cross.

19. The memory according to claim 17, which further comprises:
a second word line adjacent to the first word line and running in the second direction;
a third magnetoresistive effect element formed below the first bit line on a first side of the second word line, and connected to the first bit line; and
a third transistor having a second gate electrode, a third diffusion layer, and a fourth diffusion layer, the second gate electrode being formed by the second word line, the third diffusion layer being formed in the semiconductor substrate below the second magnetoresistive effect element and connected to the second magnetoresistive effect element, and the fourth diffusion layer being the same as the second diffusion layer, and
in which the second diffusion layer, the fourth diffusion layer, and the source contact are positioned between the first word line and the second word line, and shared by the first transistor, the second transistor, and the third transistor.

20. The memory according to claim 1, wherein
the first magnetoresistive effect element has a fixed layer in which a magnetization direction is fixed, a recording layer in which a magnetization direction is reversible, and a nonmagnetic layer formed between the fixed layer and the recording layer, and
the magnetization directions in the fixed layer and the recording layer take one of a parallel state and an anti-parallel state in accordance with a direction of an electric current flowing between the fixed layer and the recording layer.

* * * * *